United States Patent [19]

Roberts et al.

[11] Patent Number: 5,626,775

[45] Date of Patent: May 6, 1997

[54] PLASMA ETCH WITH TRIFLUOROACETIC ACID AND DERIVATIVES

[75] Inventors: David A. Roberts, Escondido; Raymond N. Vrtis, Carlsbad; Arthur K. Hochberg, Salana Beach; Robert G. Bryant, Carlsbad, all of Calif.; John G. Langan, Wescosville, Pa.

[73] Assignee: Air Products and Chemicals, Inc., Allentown, Pa.

[21] Appl. No.: 645,439

[22] Filed: May 13, 1996

Related U.S. Application Data

[60] Provisional application No. 60/006,890 Nov. 17, 1995.
[51] Int. Cl.$^6$ .................................................. H01L 21/00
[52] U.S. Cl. .................. 216/67; 216/75; 216/79; 134/1.1; 134/1.2; 438/721; 438/723; 438/724
[58] Field of Search .................. 156/646.1; 216/67, 216/79; 134/1.1, 1.2

[56] References Cited

PUBLICATIONS

"PFCs and the Semiconductor Industry: A Closer Look" by Maroulis, et al., Semiconductor International, Nov. 1994, pp. 107–110.

"Some Chemical Aspects of the Fluorocarbon Plasma Etching of Silicon and its Compounds", by Coburn, et al., IBM Journal of Research Development, vol. 23, No. 1, Jan. 1979, pp. 33–41.

Stanley Wolf, et al., in "Silicon Processing for the VSLI Era," Lattice Press, vol. 1, *Process Technology*, pp. 547–550.

*Primary Examiner*—R. Bruce Breneman
*Assistant Examiner*—Julie Ellyn Stein
*Attorney, Agent, or Firm*—Geoffrey L. Chase

[57] ABSTRACT

The present invention is directed to the etching of a material selected from the group consisting of silicon dioxide, silicon nitride, boronphosphorus silicate glass, fluorosilicate glass, siliconoxynitride, tungsten, tungsten silicide and mixtures thereof under plasma etch conditions, particularly for cleaning operations to remove silicon dioxide or silicon nitride from the walls and other surfaces within a reaction chamber of a plasma-enhanced chemical vapor deposition reactor. The etching chemicals used in the etch process are trifluoroacetic acid and it derivatives, such as; trifluoroacetic anhydride, trifluoromethyl ester of trifluoroacetic acid and trifluoroacetic acid amide and mixtures thereof.

20 Claims, No Drawings

PLASMA ETCH WITH TRIFLUOROACETIC ACID AND DERIVATIVES

The present application claims the benefit of U.S. Provisional patent application Ser. No. 60/006,890 filed Nov. 17, 1995.

TECHNICAL FIELD OF THE INVENTION

The present invention is directed to the etching of silicon dioxide, silicon nitride and other materials under plasma etch conditions, particularly for cleaning operations to remove silicon dioxide or silicon nitride from the walls and other surfaces within a reaction chamber of a plasma-enhanced chemical vapor deposition reactor and tools and apparatus therein.

BACKGROUND OF THE INVENTION

The semiconductor industry utilizes various chemicals for etching materials and for cleaning reaction chambers where semiconductor materials are processed. These etch or clean chemicals are generally divided into two groups, wet chemicals and dry or gaseous chemicals. The semiconductor industry is moving away from the use of wet chemicals because of contamination and handling problems. As the semiconductor industry moves to a greater extent to the utilization of dry chemicals or gaseous chemicals for etching and cleaning operations, the disposal of such chemicals subsequent to use is becoming a significant problem.

In the use of dry gaseous etchant chemicals for etching materials of construction in semiconductor systems or for etching and cleaning reaction chamber walls, tools and surfaces, inevitably, some of the gaseous chemical is not reacted with the contaminants or species to be etched or cleaned, and these unreacted chemicals are removed as an effluent from the reaction chamber along with various reaction by-products formed during the clean or etch. Venting of such etching and/or cleaning chemicals is coming under increasing scrutiny. For instance, exemplary gaseous chemicals used for etching and cleaning include carbontetrafluoride, hexafluoroethane, nitrogen trifluoride and sulfur hexafluoride. As reported in the article "PFCs and the Semiconductor Industry: A Closer Look," by Maroulis, et al., Semiconductor International, November 1994, pp.107–110, these potential gaseous chemical etchants or cleaning agents all have Global Warming Potential (i.e., they induce temperature rise in the earth's atmosphere). Increasingly, governments and international treaties are requiring that the venting of such Global Warming Potential chemicals be reduced or eliminated.

Therefore, within the semiconductor fabrication industry, a need exists for appropriate etching and cleaning chemicals which have acceptable performance for etching and cleaning, but which do not constitute a significant Global Warming Potential when byproducts or unreacted chemical are vented to the atmosphere.

Currently, attempts to resolve the outstanding problem with gaseous etch and clean chemicals fall into one of four categories: (1) attempts to optimize etch and/or clean processes such that less Global Warming Potential chemicals are emitted into the atmosphere, (2) attempts to recycle etch and/or clean chemicals from an exhaust stream so that they can be properly disposed of or reutilized without atmospheric emissions, (3) attempts to abate etch and/or clean chemicals in exhaust streams by chemical reaction or burn boxes which incinerate and render the unreacted etch and/or clean chemical effluents inoffensive, particularly with regard to Global Warming Potential, and (4) lastly, attempts have been made to select or develop various replacement gaseous chemicals for etch and/or clean duty, but at the present time, no acceptable candidates have been identified.

In the article, "Some Chemical Aspects of the Fluorocarbon Plasma Etching of Silicon and Its Compounds," by Coburn, et al., appearing in IBM Journal of Research Development, Vol. 23, No. 1, January 1979, pp 33–41, various etchants were studied for the etch of silicon and silicon dioxide using active gases such as oxygen, hydrogen, nitrogen, water and tetrafluoroethene with carbon tetrafluoride. The article goes on to indicate the applicability of added oxygen gas to traditional gaseous etch chemicals for etching silicon. Oxygen was reported to increase the fluorine to carbon (F/C) ratio because it was identified as an carbon scavenger. The article's conclusion is that it is desirable to have lower F/C ratios for high $SiO_2/Si$ etch ratios. Etching of silicon with chemicals which contain molecularly bound oxygen was also studied in the experiments on added oxygen, but oxygen was not added to the chemicals with molecularly bound oxygen. Trifluoroacetic anhydride was studied in the plasma etching of silicon as an example of a chemical with molecularly bound oxygen. Trifluoroacetic anhydride was reported to have only "medium" silicon etch rates. The article identifies that it is well recognized that the rate of etch of silicon and silicon dioxide are dissimilar.

Stanley Wolf, et al. in SILICON PROCESSING FOR THE VSLI ERA, Lattice Press, Vol. 1, Process Technology, pp 547–550, also describes the fact that silicon dioxide and silicon have different etch characteristics and etch preferably under different etch chemistry conditions, thus allowing for selectivities represented by the reported $SiO_2/Si$ etch ratios.

Despite knowledge of the above recited problem with etch chemicals having significant Global Warming Potential and the known use of fluorocarbons for etching generally and etching silicon specifically, particularly the use of trifluoroacetic anhydride to etch silicon, the art has failed to identify gaseous etch and/or clean chemicals which are useful for removing silicon dioxide and silicon nitride from semiconductor materials of construction or plasma reactor chamber walls and surfaces which gaseous etch and/or clean chemicals are effective with regard to etch performance, while at the same time providing a reduction in Global Warming Potential when released as an effluent into the atmosphere. The present invention overcomes the drawbacks of the prior art by utilizing a family of etch and/or clean chemicals having a surprising reactivity or etch and clean performance, while providing low Global Warming Potential for unreacted chemical effluent or reaction by-products, as set forth in greater detail below.

BRIEF SUMMARY OF THE INVENTION

The present invention is a method for etching a material selected from the group consisting of silicon dioxide, silicon nitride, boronphosphorus silicate glass, fluorosilicate glass, siliconoxynitride, tungsten, tungsten silicide and mixtures thereof under plasma reaction conditions with an etching chemical, the improvement comprising using an etching chemical selected from the group consisting of trifluoroacetic acid, trifluoroacetic anhydride, trifluoromethyl ester of trifluoroacetic acid, trifluoroacetic acid amide and mixtures thereof.

Preferably, the etching occurs in the plasma reactor chamber to clean chamber surfaces of undesired silicon dioxide and/or silicon nitride.

Preferably, the etching chemical is introduced into a plasma reactor chamber as a vapor or an entrained vapor in a carrier gas. More preferably, the carrier gas is selected from the group consisting of argon, helium, nitrogen and mixtures thereof.

Preferably, the etching chemical is mixed with oxygen.

Preferably, the oxygen is used at a flow of approximately 0–5000 standard cubic centimeters per minutes (sccm).

Preferably, the etching chemical is mixed with a plasma stabilizing gas selected from the group consisting of argon, helium and mixtures thereof.

Preferably, the etching chemical is used at a flow of approximately 1–5000 standard cubic centimeters per minute (sccm).

Preferably, a plasma power of approximately 20–5000 watts is utilized to maintain the plasma reaction conditions.

Preferably, the plasma reaction conditions include a temperature of approximately 25–500 degrees C.

Preferably, the plasma reaction conditions include a pressure of approximately 0.05–10.0 torr.

Most preferably the etching chemical is trifluoroacetic anhydride. Alternatively, the etching chemical is trifluoroacetic acid. Further alternatively, the etching chemical is trifluoromethyl ester of trifluoroacetic acid.

Preferably, silicon nitride is etched.

More preferably, the present invention is the method for etching a material selected from the group consisting of silicon dioxide, silicon nitride, boronphosphorus silicate glass, fluorosilicate glass, siliconoxynitride, tungsten, tungsten silicide and mixtures thereof under plasma reaction conditions of approximately 400–2000 standard cubic centimeters per minute flow of etching chemical, an oxygen flow of approximately 400–2500 standard cubic centimeters per minute, a plasma power of approximately 600–3500 watts, a pressure of approximately 0.7–8.0 torr and a reactor temperature of approximately 350°–420° C. using trifluoroacetic anhydride in a plasma reactor chamber.

Alternatively, the present invention is a method for etching a material selected from the group consisting of silicon dioxide, silicon nitride, boronphosphorus silicate glass, fluorosilicate glass, siliconoxynitride, tungsten, tungsten silicide and mixtures thereof under plasma reaction conditions of approximately 1600–2000 standard cubic centimeters per minute flow of etching chemical, an oxygen flow of approximately 1600–2500 standard cubic centimeters per minute, a plasma power of approximately 2500–3500 watts, a pressure of approximately 0.7–2.7 torr and a reactor temperature of approximately 400° C. using trifluoroacetic anhydride as the etching chemical in a plasma reactor chamber.

Further alternatively, the present invention is a method for etching a material selected from the group consisting of silicon dioxide, silicon nitride, boronphosphorus silicate glass, fluorosilicate glass, siliconoxynitride, tungsten, tungsten silicide and mixtures thereof under plasma reaction conditions of approximately 400–1200 standard cubic centimeters per minute flow of etching chemical, an oxygen flow of approximately 400–1200 standard cubic centimeters per minute, a plasma power of approximately 600–1200 watts, a pressure of approximately 1.5–8 torr and a reactor temperature of approximately 400° C. using trifluoroacetic anhydride as said etching chemical in a plasma reactor chamber.

DETAILED DESCRIPTION OF THE INVENTION

The semiconductor industry has the need to use dry, gaseous or vaporized etchant chemicals to etch semiconductor materials of construction and wafers, such as layers of a material selected from the group consisting of silicon dioxide, silicon nitride, boronphosphorus silicate glass, fluorosilicate glass, siliconoxynitride, tungsten, tungsten silicide and mixtures thereof, as well as to clean plasma reactor chambers where inadvertent silicon dioxide, silicon nitride, boronphosphorus silicate glass, fluorosilicate glass, siliconoxynitride, tungsten, tungsten silicide contamination is deposited on chamber inner surfaces and other surfaces interior to a plasma reactor chamber, such as; tools, boats, and support surfaces. Traditionally, the semiconductor fabrication industry has used carbon tetrafluoride and hexafluoroethane to conduct such etching and/or cleaning operations. More recently, nitrogen trifluoride has been utilized to supplant fluorocarbons for etch and/or clean duty.

However, all of these known etching or cleaning chemicals have unacceptable Global Warming Potential, that is the potential when released or vented to atmosphere to have a significant or unacceptable level of potential for global warming as recognized by governmental authorities and international treaties. In recognition of political prohibitions, some industrial sources of such fluorocarbon chemicals have restricted access to such chemicals, which hampers the semiconductor fabrication industry.

The present inventors have unexpectedly ascertained that trifluoroacetic acid and its various derivatives, including; trifluoroacetic anhydride, trifluoroacetic acid amide and trifluoromethyl ester of trifluoroacetic acid, have significant utility to provide acceptable etch and/or clean rates for the removal of material selected from the group consisting of silicon dioxide, silicon nitride, boronphosphorus silicate glass, fluorosilicate glass, siliconoxynitride, tungsten, tungsten silicide and mixtures thereof from semiconductor materials of construction, such as wafers or interior surfaces of plasma reactor chambers, tools and implements, while not having a significant contribution to Global Warming Potential of any unreacted trifluoroacetic acid, its derivatives or by-products from the vent of a semiconductor processing facility or clean operation.

Trifluoroacetic acid and its oxygen-containing derivatives have the beneficial property of having contained oxygen chemically bound within the molecule. Therefore, trifluoroacetic acid and its oxygen-containing derivatives may be utilized individually as etch and/or clean chemicals or they may be advantageously combined with a separate supply of oxygen to perform etching and/or cleaning and removal of material selected from the group consisting of silicon dioxide, silicon nitride, boronphosphorus silicate glass, fluorosilicate glass, siliconoxynitride, tungsten, tungsten silicide and mixtures thereof from semiconductor materials of construction and/or interior surfaces of plasma reactor chambers, as well as tools, support surfaces, racks, boats, etc. of a plasma reactor chamber.

Trifluoroacetic acid and its various derivatives, including; trifluoroacetic anhydride, trifluoroacetic acid amide and trifluoromethyl ester of trifluoroacetic acid are superior to the known etch and clean agents because in combination: 1) they contain little or no hydrogen which can act to stabilize free radicals initiated by the plasma which are the active etch/clean species, and 2) their contained oxygen can react with free carbon (to increase the F/C ratio) in the reaction plasma to avoid carbon ($CF_3$) reaction with free fluorine (the active etch/clean specie) that forms undesired $CF_4$, a Global Warming Potential gas.

Trifluoroacetic acid and its various derivatives, including; trifluoroacetic anhydride, trifluoroacetic acid amide and trifluoromethyl ester of trifluoroacetic acid are amenable to water scrubbing using conventional scrubbing technology and chemical systems. This greatly facilitates their use in etch and clean technologies because of the ease of their removal in the etch or clean effluents.

Although appropriate plasma reactor chamber conditions may be utilized for etching and/or cleaning using trifluoroacetic acid and its derivatives or the recited analogs, the present inventors have found that a preferred flow rate for the trifluoroacetic acid and/or its derivatives is approximately 1–5000 standard cubic centimeters per minute (sccm); potentially with an oxygen flow of approximately 0–5000 standard cubic centimeters per minute (sccm). The power utilized to induce plasma conditions for the etch or clean is preferably in the range of approximately 20–5000 watts. A preferred reactor temperature range is approximately 25°–500° C. The pressure of the reactor is preferably in the range of approximately 0.05–10.0 torr. The temperature is that of the hot platen of the semiconductor furnace which is typically operated at a temperature range of 350°–420° C., while the rest of the reactor could be at a lower temperature. Trifluoroacetic anhydride or its derivatives may be introduced with or without an entraining carrier gas. It is desirable to introduce the trifluoroacetic anhydride or its derivatives to the etch or clean zone with a carrier gas, such as argon, helium, nitrogen or mixtures thereof. In addition, it is further desirable to add a high ionization energy gas, such as argon, helium, or mixtures thereof to the process to enhance or stabilize the plasma medium during etch or clean.

In experiments utilizing trifluoroacetic anhydride, flows of the anhydride of 10–40 sccm, flows of oxygen of from 0–160 sccm, plasma power of approximately 100 watts, and a reactor temperature of 25° C. provided reasonable etch rates for cleaning or etching materials of construction.

Silicon dioxide etch rates of up to approximately 100 angstroms per minute were observed under the above conditions for a wafer of silicon dioxide placed on a wafer platen. Acceptable etch rates have also been observed for silicon dioxide on wafers placed approximately where the side walls of the plasma reaction chamber are.

The process conditions under which the present invention would preferably be used with a typical multi-wafer process furnace as is presently used in the semiconductor industry include:

| Etchant Chemical | 1600–2000 sccm |
| --- | --- |
| Oxygen | 1600–2500 sccm |
| Pressure | 0.7–2.7 torr |
| Power | 2500–3500 watts |
| Temperature | ~400° C. |

The process conditions under which the present invention would preferably be used with a typical single wafer process furnace as is presently used in the semiconductor industry include:

| Etchant Chemical | 400–1200 sccm |
| --- | --- |
| Oxygen | 400–1200 sccm |
| Pressure | 1.5–8.0 torr |
| Power | 600–1200 watts |
| Temperature | ~400° C. |

Trifluoroacetic acid and its oxygen bearing derivatives provide a significant improvement over the industry standard $C_2F_6$ for etch and clean of semiconductor furnaces and equipment. $C_2F_6$ has a low rate of utilization, in the order of approximately with the resulting effect of venting approximately 80% of the unreacted $C_2F_6$ from the etch or clean process. Abating $C_2F_6$ in an effluent stream is difficult due to its relative inertness. In addition, $C_2F_6$ forms $CF_4$ during the etch or clean process, which has one of the highest Global Warming Potentials. In contrast to $C_2F_6$, trifluoroacetic acid and its oxygen-bearing derivatives have nearly full utilization in an etch or clean process and their by-products and any unreacted material are easily abated by water scrubbing. Trifluoroacetic acid and its oxygen bearing derivatives are believed to not produce significant levels of $CF_4$ during the etch or clean process. When oxygen is added to the etch or clean process with trifluoroacetic acid or its oxygen-bearing derivatives, the potential for $CF_4$ by-product formation is even further diminished.

In summary, despite the known capability of trifluoroacetic anhydride to etch silicon itself, no one has ascertained that trifluoroacetic acid and its derivatives may be used beneficially to etch silicon dioxide, silicon nitride, boronphosphorus silicate glass, fluorosilicate glass, siliconoxynitride, tungsten or tungsten silicide either on targeted wafers in the plasma reactor chamber or to clean such material contamination from interior surfaces of plasma reactor chambers and various tools and appliances under appropriate plasma reaction conditions with resulting low species of effluents that have unacceptable Global Warming Potentials. This unexpected etch utility for silicon dioxide, silicon nitride, boronphosphorus silicate glass, fluorosilicate glass, siliconoxynitride, tungsten or tungsten silicide provides a unique solution to etching and cleaning in semiconductor fabrication while providing a high degree of freedom to meet restrictions on the effluent of chemicals having significant Global Warming Potentials. This solution to the problems confronting semiconductor fabricators has previously gone unrecognized by those skilled in the art, who recognized that silicon and silicon dioxide have different amenability to etching. Trifluoroacetic acid and its derivatives when used with oxygen to etch or clean preferably silicon dioxide or silicon nitride are believed to be particularly effective in providing acceptable etch or clean rates, while having unexpectedly low concentrations of effluent species having objectionable Global Warming Potential, in contrast to the teachings of the prior art, such as Coburn, et al., which failed to recognize the value of oxygen in combination with trifluoroacetic anhydride and taught away from using oxygen with an etching chemical when etching silicon dioxide. The use of plasma stabilizing gases, such as helium, argon or mixtures thereof is also a benefit of the present invention.

The present invention has been set forth with regard to one or more preferred embodiments, but the full scope of the present invention should be ascertained from the claims below.

We claim:

1. A method for etching a material selected from the group consisting of silicon dioxide, silicon nitride, boronphosphorus silicate glass, fluorosilicate glass, siliconoxynitride, tungsten, tungsten silicide and mixtures thereof under plasma reaction conditions with an etching chemical, the improvement comprising using an etching chemical selected from the group consisting of trifluoroacetic acid, trifluoroacetic anhydride, trifluoromethyl ester of trifluoroacetic acid, trifluoroacetic acid amide and mixtures thereof.

2. The method of claim 1 wherein said etching occurs in a plasma reactor chamber to clean chamber surfaces of undesired silicon dioxide and/or silicon nitride.

3. The method of claim 1 wherein said etching chemical is introduced into a plasma reactor chamber as a vapor or an entrained vapor in a carrier gas.

4. The method of claim 3 wherein said carrier gas is selected from the group consisting of argon, helium, nitrogen and mixtures thereof.

5. The method of claim 1 wherein said etching chemical is mixed with oxygen.

6. The method of claim 1 wherein said etching chemical is mixed with oxygen at a flow of approximately 0–5000 standard cubic centimeters per minutes (sccm).

7. The method of claim 1 wherein said etching chemical is mixed with a plasma stabilizing gas selected from the group consisting of argon, helium and mixtures thereof.

8. The method of claim 1 wherein said etching chemical is used at a flow of approximately 1–5000 standard cubic centimeters per minute (sccm).

9. The method of claim 1 wherein a plasma power of approximately 20–5000 watts is utilized to maintain said plasma reaction conditions.

10. The method of claim 1 wherein said plasma reaction conditions include a temperature of approximately 25–500 degrees C.

11. The method of claim 1 wherein said plasma reaction conditions include a pressure of approximately 0.05–10.0 torr.

12. The method of claim 1 wherein said etching chemical is trifluoroacetic anhydride.

13. The method of claim 1 wherein said etching chemical is trifluoroacetic acid.

14. The method of claim 1 wherein said etching chemical is trifluoromethyl ester of trifluoroacetic acid.

15. The method of claim 1 wherein silicon nitride is etched.

16. The method of claim 1 wherein said material is on a wafer.

17. The method of claim 1 wherein said material is on a plurality of wafers.

18. A method for etching a material selected from the group consisting of silicon dioxide, silicon nitride, boron-phosphorus silicate glass, fluorosilicate glass, siliconoxynitride, tungsten, tungsten silicide and mixtures thereof under plasma reaction conditions of approximately 400–2000 standard cubic centimeters per minute flow of etching chemical, an oxygen flow of approximately 400–2500 standard cubic centimeters per minute, a plasma power of approximately 600–3500 watts, a pressure of approximately 0.7–8 torr and a reactor temperature of approximately 350°–420° C. using trifluoroacetic anhydride as said etchant chemical in a plasma reactor chamber.

19. A method for etching a material selected from the group consisting of silicon dioxide, silicon nitride, boron-phosphorus silicate glass, fluorosilicate glass, siliconoxynitride, tungsten, tungsten silicide and mixtures thereof under plasma reaction conditions of approximately 1600–2000 standard cubic centimeters per minute flow of etching chemical, an oxygen flow of approximately 1600–2500 standard cubic centimeters per minute, a plasma power of approximately 2500–3500 watts, a pressure of approximately 0.7–2.7 torr and a reactor temperature of approximately 400° C. using trifluoroacetic anhydride as said etching chemical in a plasma reactor chamber.

20. A method for etching a material selected from the group consisting of silicon dioxide, silicon nitride, boron-phosphorus silicate glass, fluorosilicate glass, siliconoxynitride, tungsten, tungsten silicide and mixtures thereof under plasma reaction conditions of approximately 400–1200 standard cubic centimeters per minute flow of etching chemical, an oxygen flow of approximately 400–1200 standard cubic centimeters per minute, a plasma power of approximately 600–1200 watts, a pressure of approximately 1.5–8 torr and a reactor temperature of approximately 400° C. using trifluoroacetic anhydride as said etching chemical in a plasma reactor chamber.

* * * * *